(12) United States Patent
Ko

(10) Patent No.: US 6,806,933 B2
(45) Date of Patent: Oct. 19, 2004

(54) ARRAY SUBSTRATE WITH MULTI-LAYER ELECTRODE LINE

(75) Inventor: Byung-Soo Ko, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 211 days.

(21) Appl. No.: 09/742,473

(22) Filed: Dec. 22, 2000

(65) Prior Publication Data

US 2001/0050743 A1 Dec. 13, 2001

(30) Foreign Application Priority Data

Dec. 31, 1999 (KR) ........................................ 1999-67841

(51) Int. Cl.$^7$ ........................ G02F 1/136; G02F 1/1343
(52) U.S. Cl. ............................ 349/139; 349/43; 349/46
(58) Field of Search ............................ 349/139, 43, 46

(56) References Cited

U.S. PATENT DOCUMENTS

| | | | | |
|---|---|---|---|---|
| 5,162,933 A | * | 11/1992 | Kakuda et al. ............... | 349/46 |
| 5,183,533 A | * | 2/1993 | Tsutsumi et al. ............ | 216/108 |
| 5,361,153 A | * | 11/1994 | Shimamune et al. ....... | 349/139 |
| 5,852,481 A | * | 12/1998 | Hwang ......................... | 349/43 |
| 6,048,783 A | * | 4/2000 | Kim et al. ................... | 438/588 |
| 6,081,308 A | * | 6/2000 | Jeong et al. .................. | 349/42 |
| 6,172,733 B1 | * | 1/2001 | Hong et al. ................. | 349/152 |
| 6,188,452 B1 | * | 2/2001 | Kim et al. ..................... | 349/43 |
| 6,404,473 B1 | * | 6/2002 | Kaneko et al. ............. | 349/139 |
| 6,433,842 B1 | * | 8/2002 | Kaneko et al. ............... | 349/43 |
| 6,486,494 B2 | * | 11/2002 | Jeong et al. .................. | 257/59 |

\* cited by examiner

Primary Examiner—Huyen Ngo
(74) Attorney, Agent, or Firm—Birch, Stewart, Kolasch & Birch, LLP

(57) ABSTRACT

The present invention discloses a method of manufacturing an array substrate, comprising: forming an electrode line on a substrate using a wet etching technique; and forming an organic insulating layer on an exposed surface of the substrate while covering the electrode line, wherein the electrode line has a side portion having an overhang or a taper angle of more than 45° C. Due to the method, the ashing process using a dry etchant gas cannot be needed anymore.

12 Claims, 3 Drawing Sheets

ARRAY SUBSTRATE WITH MULTI-LAYER ELECTRODE LINE

CROSS REFERENCE

This application claims the benefit of Korean Patent Application No. 1999-67841, filed on Dec. 31, 1999, under 35 U.S.C. §119, the entirety of which is hereby incorporated by reference.

BACKGROUND OF THE INVENTION

1. Field of the Invention

The present invention relates to a liquid crystal display (LCD) device, and more particularly, to a method of manufacturing an array substrate for a LCD device.

2. Description of Related Art

Active matrix LCD devices, where thin film transistors (TFTs) and pixel electrodes are arranged in the form of a matrix, have been widely used due to a high resolution and an excellent performance of implementing moving images.

FIG. 1 is a cross-sectional view illustrating a liquid crystal panel of a typical active matrix LCD device. As shown in FIG. 1, the liquid crystal panel 20 includes lower and upper substrates 2 and 4 with a liquid crystal layer 10 interposed. The lower substrate 2 on a transparent substrate 1 has two regions: a region S; and a region P. TFTs are arranged on the region S as a switching element, and pixel electrodes 14 are arranged on the pixel region P. The upper substrate 4 includes a color filter 8 and a common electrode 12 on a transparent substrate 1. Through the pixel electrode 14 and the common electrode 12, voltages are applied to the liquid crystal layer 10. In order to prevent a leakage of the liquid crystal, edge portions of the two substrate 2 and 4 are sealed by a sealant 6.

FIG. 2 is a plan view illustrating the lower array substrate 2 of FIG. 1. As shown in FIG. 2, gate lines 22 are arranged in a transverse direction, and data lines 24 are arranged in a longitudinal direction perpendicular to the gate lines 22. A pixel region is defined by the gate and data lines 22 and 24, and pixel electrodes 14 is formed on the pixel region. Thin film transistors (TFTs) "T" are formed at a crossing point of the gate and data lines 22 and 24. Each of the TFTs "T" includes a gate electrode 26, a source electrode 28 and a drain electrode 30. The gate electrode 26 extends from the gate line 22, and the source electrode 28 extends from the data line 24. The drain electrode 30 is spaced apart from the source electrode 28 and contacts with the pixel electrode 14 through a contact hole 30a. Over a portion of the gate line 22, a storage capacitor Cst is formed. In other words, in order to form the storage capacitor Cst, a portion of the pixel electrode 14 overlaps a portion of the gate electrode 22 while interposing an insulating layer therebetween.

The active matrix LCD device is operated as follows. When a voltage is applied to the gate electrode 26 of the TFT "S", a data signal is applied to the pixel electrode 14. On the contrary, when no voltage is applied to the gate electrode 26, data signal is not applied to the pixel electrode 14.

The liquid crystal panel 20 is manufactured through several complex processes. Especially, the lower substrate is manufactured through several mask processes. In general, the more complex the manufacturing process is, the higher a possibility of an inferiority rate becomes. Therefore, it is important to simplify a manufacturing process.

Whether a manufacturing process of the lower substrate is complex or not depends on a kind of a material used to form components and a device performance. For example, in case of a large LCD device of more than 12 inches, a specific resistance value of a material used for a gate line is a very important parameter to determine a display quality. Therefore, in case of a large-sized LCD device, a low resistive material such as aluminum and aluminum alloy is preferably used as a material of a gate electrode. However, an aluminum-based metal is low in resistance but has a low corrosion resistance. Since aluminum has a low corrosion resistance, it may be opened in a subsequent process due to an etchant. In order to prevent a possible line open, a metal having a high corrosion resistance such as Cr and Mo is used as the second metal layer. That is, when a low resistive aluminum-based metal is used as a first metal layer to reduce a RC delay, the other metal such Cr and Mo is used a second metal layer.

FIGS. 3A to 3C are cross-sectional views taken along line III—III of FIG. 2, and illustrate a manufacturing process of the gate line. First, as shown in FIG. 3A, an AlNd layer 40 and a molybdenum (Mo) layer 42 are formed sequentially on a substrate 1. Then, a photoresist 44 is applied on the molybdenum layer 44.

Subsequently, as shown in FIG. 3B, the AlNd layer 40 and the molybdenum (Mo) layer 42 are simultaneously etched through a mask process to form the gate line 22 of a dual-layered structure. At this time, the AlNd layer 40 and the molybdenum (Mo) layer 42 have different etching rate from each other due to Galvanic Corrosion. For the more detail, since the AlNd layer 40 has a high etching rate in an etching solution, it is difficult to control the etching rate. Further, since the AlNd layer 40 is higher in etching rate than the molybdenum layer 42, its vertical side portion is more etched than that of the molybdenum layer 42. Therefore, the gate line 22 has a taper shape and an overhang "O" that a side portion of the molybdenum layer 42 is protruded outwardly.

The gate pattern having such an overhang cannot have a good step coverage for an insulating layer formed thereon. Therefore, the gate pattern may cause defects such as a line open and a dielectric breakdown. Further, overhang can occur in the gate line of a single-layered structure, and defects such as a line open may occur. Such defects lower a manufacturing yield as well as electrical characteristics of the gate line. Such problems lower a manufacturing yield and electrical characteristics of the gate line. In order to remove the overhang portion "O", as shown in FIG. 3C, only the second metal layer 42 is dry-etched using the patterned photoresist 45 as a mask. At this time, the photoresist 45 and the overhang portion "O" of the molybdenum 42 are simultaneously removed. In other words, the gate electrode and the gate line having no overhang are formed in such a way that an etching gas containing an oxygen ($O_2$) and a fluorine-based gas used an dry-etching gas ashes a portion of the photoresist 45 and then a portion of the molybdenum layer 42 is oxidized and removed.

However, since the method of manufacturing an array substrate described above additionally employs the dry-etching in order to remove the overhang portion of the electrode line, the manufacturing process becomes complicated and the number of the manufacturing processes becomes increased. Further, since the dry-etching process uses the large-sized equipment compared with the wet-etching process, a production cost becomes increased.

SUMMARY OF THE INVENTION

To overcome the problems described above, preferred embodiments of the present invention provide a method of manufacturing an array substrate by a simple manufacturing process at a low production cost.

Another object of the present invention is to provide a method of manufacturing an array substrate for a liquid crystal display device having a high aperture ratio.

In order to achieve the above object, the preferred embodiments of the present invention provide a method of manufacturing an array substrate, comprising: forming an electrode line on a substrate using a wet etching technique; and forming an organic insulating layer on an exposed surface of the substrate while covering the electrode line, wherein the electrode line has a side portion having an overhang or a taper angle of more than 45° C.

The organic insulating layer is made of one of benzocyclobutene, an olefin-based insulating material, an acrylic-based insulating material, and a silicon-based insulating material.

The electrode line may have first and second metal layers of a dual-layered structure, and a side portion of the first metal layer is more etched than that of the second metal layer. The first metal layer is made of one of aluminum, an aluminum alloy, AlNd, copper and a copper alloy, and the second metal layer is made of one of Cr, Cr-alloy, Mo, Mo-alloy, Ta, Ta-alloy, W, and W-alloy.

The electrode line may have first, second and third metal layers of a three-layered structure, and a side portion of the second metal layer is less etched to protrude beyond that of the first and third metal layers.

In an another aspect of the invention, the present invention provides an array substrate for a liquid crystal display device, comprising: an electrode line formed on a substrate; and an organic insulating layer formed on an exposed surface of the substrate while covering the electrode line, wherein a side portion of the electrode line has an overhang or a taper angle more than 45° C. The electrode line may have a dual-layered structure or a three-layered structure.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 4A:
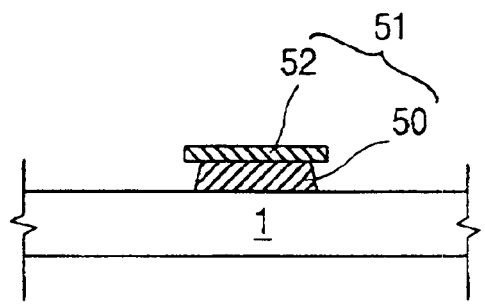
FIGS. 4A and 4B are cross-sectional views illustrating a method of manufacturing an array substrate according to a preferred embodiment of the present invention.
Figure 4B:
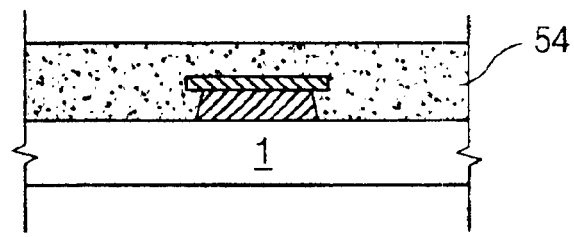

FIGS. 4A and 4B are cross-sectional views illustrating a method of forming an electrode line 51 and an insulating layer 54. First, as shown in FIG. 4A, first and second metal layers 50 and 52 are sequentially deposited on a substrate 1 and then are patterned into a wire electrode 51 of a dual-layered structure. The first metal layer 50 is made of a low resistive metal such as an aluminum-based metal and a copper-based metal. The second metal layer 52 is made of a material having a high corrosion resistance, for example, Cr, Mo, Ta, W, or their alloy.

The electrode line 51 has an overhang portion due to a difference of an etching rate between the first and second metal layers 50 and 52. In the conventional art, in order to remove the overhang portion, the dry-etching process is additionally performed. In order to insulate the electrode line, an inorganic insulating layer made of SiNx or $SiO_2$ is formed. However, in the preferred embodiment of the present invention, in order to insulate the electrode line 51 having the overhang portion, an organic insulating layer 54 is applied using a coating technique, and therefore it is easy to form the organic insulating layer 54 compared with the conventional art using a vacuum deposition technique. Further, since the organic insulating layer 54 is excellent in flatness and has a dielectric constant of less than 3(three), there is an advantage that an aperture ratio of a liquid crystal display device can be improved.

Figure 1:
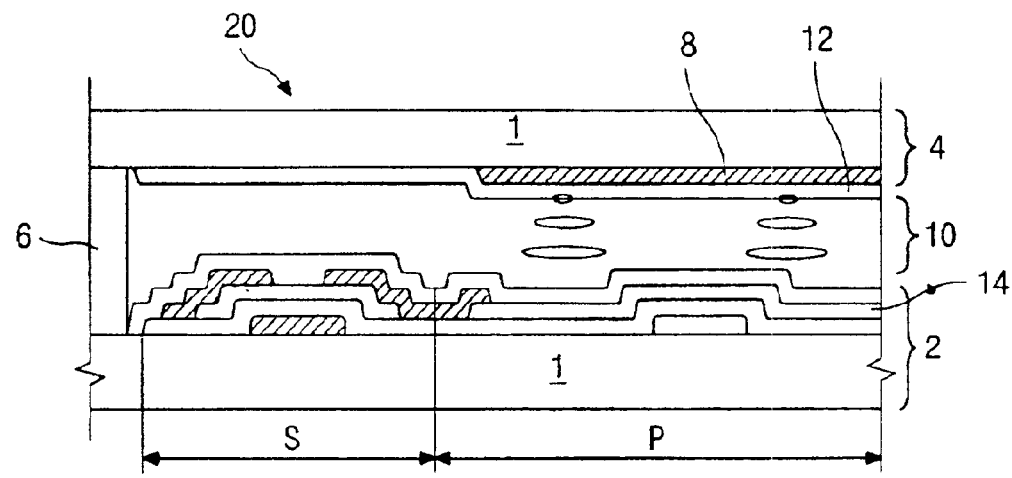
FIG. 1 is a cross-sectional view illustrating a liquid crystal panel of a typical active matrix liquid crystal display device.
Figure 2:
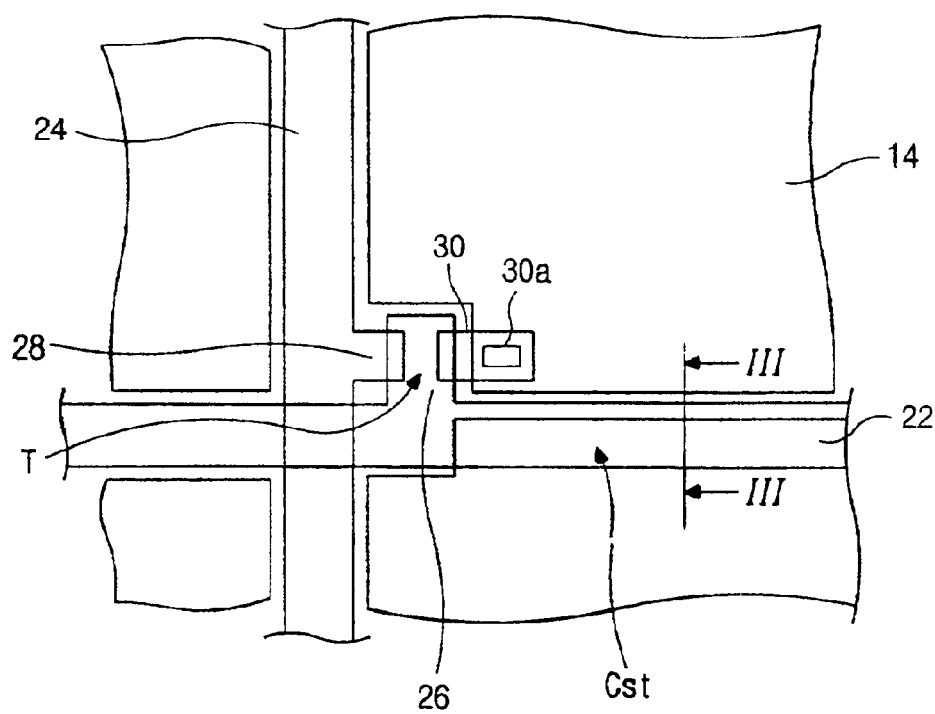
FIG. 2 is a plan view illustrating the lower array substrate 2 FIG. 1.
Figure 3A:
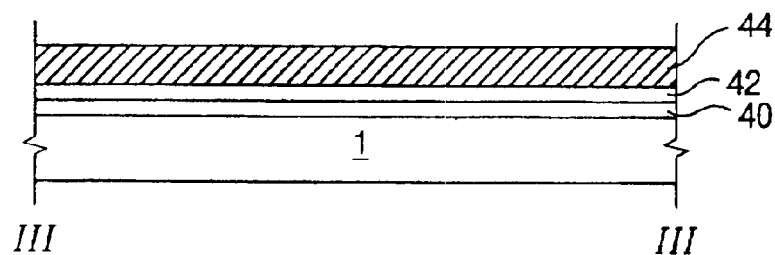
FIGS. 3A to 3C are cross-sectional views taken along line III—III of FIG. 2.
Figure 3B:
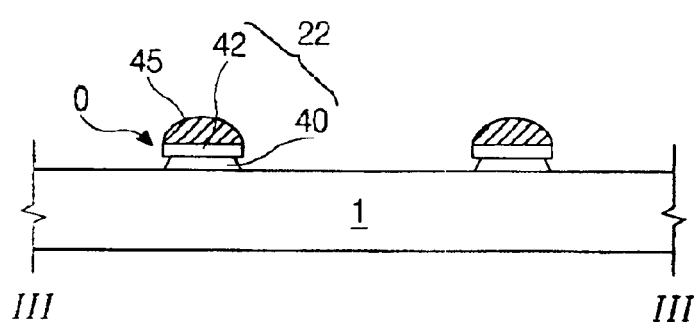
Figure 3C:
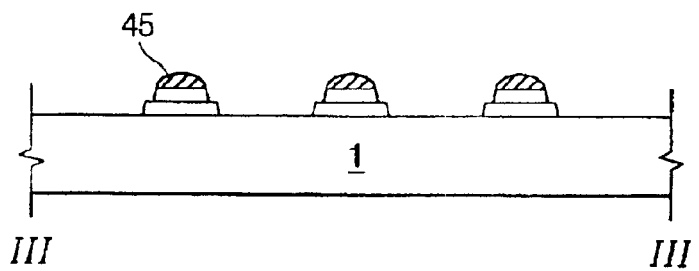

The line 51 of the FIG. 4A, can be a data line usually having a single layer structure. In other words, since the inorganic insulating layer has a dielectric constant of more than 6(six), when it is used as an inter-layer insulator between the data line 24 and the pixel electrode 14 (see FIG. 2), in order to reduce a parasitic capacitance between the data line 24 and the pixel electrode 14, the pixel electrode 14 is horizontally spaced apart from the data line 24 (see FIG. 2).

However, in the preferred embodiment of the present invention, since the organic insulating layer having a dielectric constant of less than 3 is used as an insulating layer of the data line, a parasitic capacitance between the data line and the pixel electrode is reduced, and thus the pixel electrode can overlap the data line vertically, whereupon an aperture ratio increases. The organic insulating layer is made of benzocyclobutene, acrylic and the like. Further, a silicon-based material, an acrylic-based material, or an olefin-based material may be used as the organic insulating layer.

Figure 5:
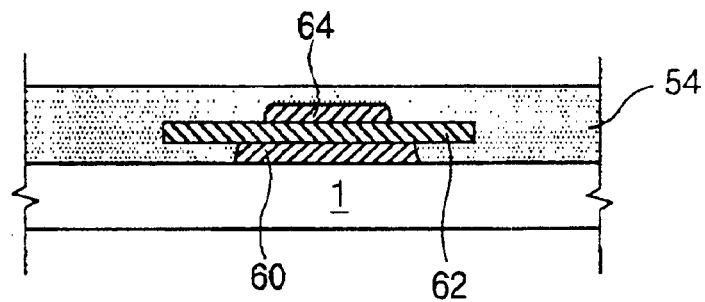
FIG. 5 is a cross-sectional view illustrating a method of manufacturing an array substrate according to another preferred embodiment of the present invention.

FIG. 5 is a cross-sectional view illustrating a method of forming an organic insulating layer when a wire electrode of a three-layered structure is formed according to the preferred embodiment of the present invention. As shown in FIG. 5, a first metal layer 60 is formed on a substrate 1, and a second metal layer 62 is formed on the first metal layer 60. Further, a third metal layer 64 is formed on the second metal layer 62. An organic insulating layer 54 is formed over the whole surface of the substrate 1 while covering the first, second and third metal layers 60, 62 and 64. The first and third metal layers 60 and 64 is made of a low resistive material such as an aluminum-based metal or a copper-based metal. The second metal layer 62 is made of a material having high corrosion resistance such as Cr, Mo, Ta, W, or their alloys.

When the first, second and third metal layers 60, 62 and 64 are simultaneously etched, as shown in FIG. 5, an overhang portion may occur. However, in the preferred embodiment of the present invention, an additional process to remove the overhang portion is not required. The organic insulating layer 54 is formed in order to insulate the second metal layer 62 having the overhang portion and the first and third metal layers 60 and 64. The overhang portion may occur in the first and third metal layers 60 and 64, but even though an undercut occurs, it is possible to insulate defects such as the under cut and the overhang occurred in the wire electrode just by applying the organic insulating layer 54 as described above.

Even though not shown, the organic insulating layer according to the preferred embodiment of the present invention can be applied to a method of manufacturing an electrode line having no overhang but a taper angle of more than 45° from a top surface of the electrode line. In other words, when the electrode line is a single-layered structure and has a taper angle of more than 45°, it is preferable that the organic insulating layer is formed as an insulating layer for insulating the electrode line. Therefore, defects such as a line open can be prevented.

As described herein before, using the method of manufacturing the array substrate according to the preferred embodiment of the present invention, since an additional process to remove an overhang portion is not necessary, a manufacturing process becomes simplified. Further, since a step coverage of the insulating layer becomes better, defects such as a line open and an insulation destruction can be prevented. Furthermore, since a parasitic capacitance between the data line and the pixel electrode becomes reduced, the pixel electrode can overlaps the data line vertically, whereby a liquid crystal display having a high aperture ratio can be achieved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing an array substrate, comprising:
    forming an electrode line on a substrate using a wet etching technique; and
    forming an organic insulating layer on an exposed surface of the substrate while covering the electrode line,
    wherein the electrode line has a side portion having an overhang or a taper angle of more than 45° from a top surface of the electrode line.

2. The method of claim 1, wherein the organic insulating layer is made of one of benzocyclobutene, an olefin-based insulating material, an acrylic-based insulating material, and a silicon-based insulating material.

3. The method of claim 1, wherein the electrode line has first and second metal layers of a dual-layered structure, and a side portion of the first metal layer is more etched than a side portion of the second metal layer.

4. The method of claim 3, wherein the first metal layer is made of one of aluminum, an aluminum alloy, AlNd, copper or a copper alloy.

5. The method of claim 3, wherein the second metal layer is made of one of Cr, Cr-alloy, Mo, Mo-alloy, Ta, Ta-alloy, W, or W-alloy.

6. The method of claim 1, wherein the electrode line has first, second and third metal layers of a three-layered structure, and a side portion of the second metal layer is less etched than that of the first and third metal layers.

7. An array substrate for a liquid crystal display device, comprising:
    an electrode line formed on a substrate; and
    an organic insulating layer formed on an exposed surface of the substrate while covering the electrode line,
    wherein the electrode line has an overhang or a taper angle of a side portion of the electrode line is more than 45° from a top surface of the electrode line.

8. The array substrate of claim 7, wherein the organic insulating layer is made of one of benzocyclobutene, an olefin-based insulating material, an acrylic-based insulating material, and a silicon-based insulating material.

9. The array substrate of claim 7, wherein the electrode line has first and second metal layers of a dual-layered structure, and a side portion of the first metal layer is more etched than that of the second metal layer.

10. The array substrate of claim 9, wherein the first metal layer is made of one of aluminum, an aluminum alloy, AlNd, copper or a copper alloy.

11. The array substrate of claim 9, wherein the second metal layer is made of one of Cr, Cr-alloy, Mo, Mo-alloy, Ta, Ta-alloy, W, or W-alloy.

12. The array substrate of claim 7, wherein the electrode line has first, second and third metal layers of a three-layered structure, and a side portion of the second metal layer protrudes beyond side portions of the first and third metal layers.

* * * * *